(12) United States Patent
Yamada

(10) Patent No.: US 9,257,961 B2
(45) Date of Patent: *Feb. 9, 2016

(54) RESONATOR ELEMENT AND RESONATOR HAVING A TAPERED ARM NEXT TO THE BASE

(71) Applicant: Seiko Epson Corporation, Tokyo (JP)

(72) Inventor: Akinori Yamada, Ina (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,190

(22) Filed: Jul. 21, 2014

(65) Prior Publication Data

US 2014/0327342 A1 Nov. 6, 2014

Related U.S. Application Data

(63) Continuation of application No. 14/255,421, filed on Apr. 17, 2014, which is a continuation of application No. 13/079,163, filed on Apr. 4, 2011, now Pat. No. 8,816,572.

(30) Foreign Application Priority Data

Apr. 8, 2010 (JP) .................................. 2010-089259

(51) Int. Cl.
*H03H 9/21* (2006.01)
*H03H 9/15* (2006.01)
*H03H 9/215* (2006.01)
*H03H 9/17* (2006.01)

(52) U.S. Cl.
CPC . *H03H 9/15* (2013.01); *H03H 9/17* (2013.01); *H03H 9/21* (2013.01); *H03H 9/215* (2013.01)

(58) Field of Classification Search
CPC ....... H03H 9/21; H03H 9/2468; H03H 9/215; H03H 2003/026; B06B 1/0659
USPC ................... 310/370; 331/156, 200
See application file for complete search history.

(56) References Cited

U.S. PATENT DOCUMENTS

| 7,518,291 B2 | 4/2009 | Tanaya |
| 8,183,750 B2 | 5/2012 | Yamada |
| 8,816,572 B2 * | 8/2014 | Yamada ........................ 310/370 |
| 2005/0140252 A1 | 6/2005 | Miyata et al. |

(Continued)

FOREIGN PATENT DOCUMENTS

| JP | 2005-005896 A | 1/2005 |
| JP | 2005-151423 A | 6/2005 |

(Continued)

*Primary Examiner* — J. San Martin
(74) *Attorney, Agent, or Firm* — Harness, Dickey & Pierce, P.L.C.

(57) ABSTRACT

A resonator element includes: at least one resonating arm which performs flexural vibration; a base portion connected to an end of the resonating arm; and a tapered portion which is axisymmetrical with respect to a centerline which bisects the width of the resonating arm, and which has a width increasing toward a portion of the tapered portion connected to the base portion from a portion of the tapered portion connected to the resonating arm, wherein assuming that the length and width of the resonating arm are L and W and the length and width of the tapered portion are Lt and Wt, the shape of the tapered portion is controlled to satisfy a taper length occupancy η=Lt/L and a taper width occupancy ξ=2 Wt/W.

14 Claims, 6 Drawing Sheets

(56) References Cited

U.S. PATENT DOCUMENTS

| | | |
|---|---|---|
| 2006/0214749 A1 | 9/2006 | Yamada |
| 2008/0211350 A1 | 9/2008 | Tanaya et al. |
| 2009/0021120 A1 | 1/2009 | Piazza et al. |
| 2009/0066194 A1 | 3/2009 | Yamamoto |
| 2009/0289531 A1 | 11/2009 | Fang et al. |
| 2010/0096955 A1 | 4/2010 | Yamada |
| 2010/0164331 A1 | 7/2010 | Yamada |
| 2010/0171397 A1 | 7/2010 | Yamada |
| 2010/0219898 A1 | 9/2010 | Yamada |
| 2010/0244989 A1 | 9/2010 | Furuhata et al. |
| 2011/0260587 A1 | 10/2011 | Yamada |
| 2012/0137775 A1* | 6/2012 | Yamada ................ 73/504.16 |
| 2012/0248938 A1* | 10/2012 | Kawanishi ................ 310/344 |
| 2013/0169115 A1 | 7/2013 | Yamada |

FOREIGN PATENT DOCUMENTS

| | | |
|---|---|---|
| JP | 2005-184767 A | 7/2005 |
| JP | 2006-121411 A | 5/2006 |
| JP | 2006-270177 A | 10/2006 |
| JP | 2006-352771 A | 12/2006 |
| JP | 2008-306468 A | 12/2008 |
| JP | 2010-157933 A | 7/2010 |
| JP | 2010-171965 A | 8/2010 |
| JP | 2010-171966 A | 8/2010 |
| JP | 2010-226608 A | 10/2010 |
| JP | 2010-226610 A | 10/2010 |
| JP | 2010-233204 A | 10/2010 |
| JP | 2010-252302 A | 11/2010 |
| WO | WO-00-44092 A1 | 7/2000 |
| WO | WO-2005-076471 A1 | 8/2005 |

* cited by examiner

RESONATOR ELEMENT AND RESONATOR HAVING A TAPERED ARM NEXT TO THE BASE

CROSS-REFERENCE TO RELATED APPLICATIONS

This application is a continuation application of U.S. patent application Ser. No. 14/255,421 filed Apr. 17, 2014, which is a continuation application of U.S. patent application Ser. No. 13/079,163 filed on Apr. 4, 2011, which claims the benefit of Japanese Patent Application No. 2010-089259 filed Apr. 8, 2010, all of which are incorporated herein by reference in their entireties.

BACKGROUND

1. Technical Field

The present invention relates to a resonator element and a resonator having the resonator element.

2. Related Art

There is known a resonator element which has a resonating arm and a base portion connected to the resonating arm and in which a tapered portion symmetrical with respect to the vibration center of the resonating arm is provided in a connection portion between the resonating arm and the base portion (for example, refer to JP-A-2005-5896).

In the resonator element disclosed in JP-A-2005-5896, by providing a tapered portion in a connection portion between the resonating arm and the base portion, leakage of fundamental vibration is suppressed, the Q factor is increased accordingly so that a vibration mode is not affected, and it is also possible to prevent the resonator element from being broken by an impact or prevent deterioration of a vibration mode.

In the case where a tapered portion is provided in practice, however, the Q factor is often decreased depending on the shape of the tapered portion. Presumably, this is because a thermoelastic loss resulting from the shape of the tapered portion exceeds an increase in the Q factor resulting from a suppression effect of vibration leakage by providing the tapered portion.

SUMMARY

An advantage of the invention is to solve at least a part of the above-described problems, and the invention can be implemented as the following forms or application examples.

APPLICATION EXAMPLE 1

According to this application example of the invention, there is provided a resonator element including: at least one resonating arm which performs flexural vibration; a base portion connected to an end of the resonating arm; and a tapered portion which is axisymmetrical with respect to the vibration center of the resonating arm and which has a width increasing toward a portion of the tapered portion connected to the base portion from a portion of the tapered portion connected to the resonating arm. Assuming that length and width of the resonating arm are L and W and length and width of the tapered portion are Lt and Wt, the shape of the tapered portion is controlled to satisfy a taper length occupancy $\eta=Lt/L$ and a taper width occupancy $\xi=2Wt/W$.

According to this application example of the invention, by controlling the shape of the tapered portion with the taper length occupancy $\eta$ and the taper width occupancy $\xi$, it is possible to find out the shape of the tapered portion capable of suppressing the thermoelastic loss. As a result, it is possible to realize a resonator element with a stable vibration mode by increasing the Q factor compared with the case where a tapered portion is not provided or the case where a tapered portion is simply provided.

APPLICATION EXAMPLE 2

In the resonator element according to the above application example of the invention, it is preferable that the taper width occupancy $\xi$ is in a range of $2.409\eta^2+4.728\times10^{-2}\eta+2.959\times10^{-2}\leq\xi\leq-4.723\times10^1\eta^2+1.434\times10^1\eta+1.711\times10^{-2}$ when the range of the taper length occupancy $\eta$ is $0.016\leq\eta\leq0.1680$ and that the shape of the tapered portion is formed by a straight line or a curved line connecting the position of the tapered portion connected to the resonating arm and the position thereof connected to the base portion.

By setting the taper width occupancy $\xi$ within such a range with respect to the taper length occupancy $\eta$, it is possible to obtain a Q factor about 1.1 times the Q factor when the tapered portion is not provided.

APPLICATION EXAMPLE 3

In the resonator element according to the above application example of the invention, it is preferable that the taper width occupancy is in a range of $9.417\eta^2-6.358\times10^{-1}\eta+9.984\times10^{-2}\leq\xi\leq-5.255\times10^1\eta^2+1.394\times10^1\eta-1.219\times10^{-1}$ when the range of the taper length occupancy $\eta$ is $0.0168\leq\eta\leq0.1680$ and that the shape of the tapered portion is formed by a straight line or a curved line connecting the position the tapered portion connected to the resonating arm and the position thereof connected to the base portion.

By setting the taper width occupancy $\xi$ within such a range with respect to the taper length occupancy $\eta$, it is possible to obtain a Q factor about 1.2 times the Q factor when the tapered portion is not provided.

APPLICATION EXAMPLE 4

In the resonator element according to the above application example of the invention, it is preferable that the taper width occupancy $\xi$ is in a range of $5.191\times10^1\eta^2-6.959\eta+4.339\times10^{-1}\leq\xi\leq-9.160\times10^1\eta^2+1.899\times10^1\eta-4.679\times10^{-1}$ when the range of the taper length occupancy $\eta$ is $0.0504\leq\eta\leq0.1260$ and that the shape of the tapered portion is formed by a straight line or a curved line connecting the position of the tapered portion connected to the resonating arm and the position thereof connected to the base portion.

By setting the taper width occupancy $\xi$ within such a range with respect to the taper length occupancy $\eta$, it is possible to obtain a Q factor about 1.3 times the Q factor when the tapered portion is not provided.

APPLICATION EXAMPLE 5

In the resonator element according to the above application example of the invention, it is preferable that the shape of the tapered portion is formed by connection of a plurality of straight lines and that crossing angles between the plurality of straight lines are smaller than a crossing angle between an extended line of the resonating arm and a straight line connecting the position of the tapered portion connected to the resonating arm and the position thereof connected to the base portion.

Thus, if the tapered portion has a shape formed by connection of a plurality of straight lines, stress generated in the tapered portion is dispersed. Accordingly, since distortion is also dispersed, temperature gradient is decreased and the heat flow is suppressed. As a result, a thermoelastic loss is reduced and the Q factor can be increased.

APPLICATION EXAMPLE 6

In the resonator element according to the above application example of the invention, it is preferable that the shape of the tapered portion is formed by one continuous curved line connecting the position of the tapered portion connected to the resonating arm and the position thereof connected to the base portion and that a crossing angle between the curved line and the resonating arm is smaller than a crossing angle between an extended line of the resonating arm and a straight line connecting the position of the tapered portion connected to the resonating arm and the position thereof connected to the base portion.

As described above, since stress and distortion can be dispersed and the thermoelastic loss can be reduced by forming the shape of a tapered portion by a plurality of straight lines, as the number of the straight lines increases, the thermoelastic loss can be reduced accordingly. Therefore, if the shape of the tapered portion is formed by a curved line, the thermoelastic loss can be further reduced.

APPLICATION EXAMPLE 7

According to this application example of the invention, there is provided a resonator including the resonator element described in any of the above examples, which is housed in a package.

The resonator element described above is housed in a package formed of ceramic, for example. The inside of the package is preferably in a vacuum state. When the resonator element vibrates in a vacuum environment, it can maintain more stable vibration over a long period of time.

In addition, since the resonator element is housed in the package, its handling is easy and it can be protected against external environments, such as humidity.

BRIEF DESCRIPTION OF THE DRAWINGS

The invention will be described with reference to the accompanying drawings, wherein like numbers reference like elements.

FIG. 10A is a plan view and FIG. 10B is a cross-sectional view taken along the line E-E of FIG. 10A.

DESCRIPTION OF EXEMPLARY EMBODIMENTS

Figure 1:
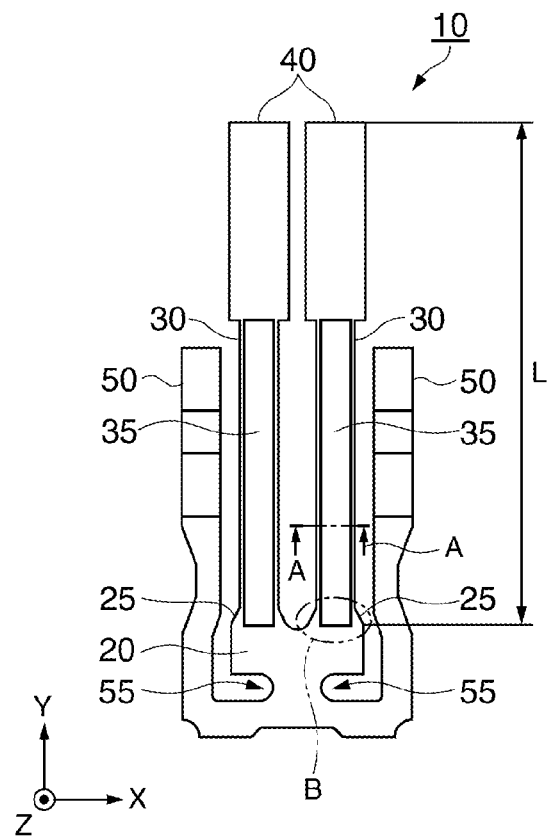
FIG. 1 is a plan view showing the schematic configuration of a resonator element according to a first embodiment.

Hereinafter, embodiments of the invention will be described with reference to the accompanying drawings.

Moreover, in the drawings referred to in the following explanation, the scale of each member or portion is adjusted for convenience of illustration.

First Embodiment

Figure 2A:
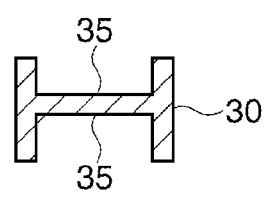
FIG. 2A is a cross-sectional view taken along the line A-A of FIG. 1.
Figure 2B:
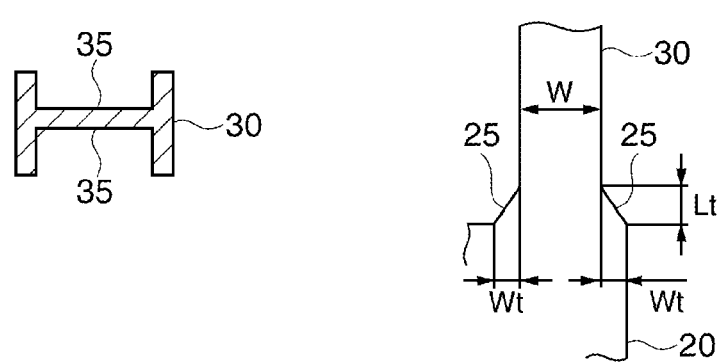
FIG. 2B is a partial plan view showing a B portion of FIG. 1 in an enlarged manner.

FIG. 1 is a plan view showing the schematic configuration of a resonator element according to a first embodiment. FIG. 2A is a cross-sectional view taken along the line A-A of FIG. 1, and FIG. 2B is a partial plan view showing a B portion of FIG. 1 in an enlarged manner. First, the schematic configuration of a resonator element will be described with reference to FIG. 1. A resonator element 10 is spread out on the plane having an X axis and a Y axis perpendicular to the X axis, and a Z axis indicates a thickness.

Although a material of the resonator element 10 according to the present embodiment is not particularly limited, it may be quartz crystal, a piezoelectric material other than quartz crystal, or other materials. In the case of quartz crystal, it is cut out from a single crystal of quartz crystal such that the X, Y, and Z axes become an electrical axis, a mechanical axis, and an optical axis, respectively.

In addition, although the resonator element 10 according to the present embodiment shows an element used for a resonator, it may also be applied to an acceleration sensor or a gyro sensor.

The resonator element 10 includes: two parallel resonating arms 30 which extend in the Y-axis direction and flexurally vibrate in the X-axis direction; a base portion 20 connected to one end of the respective resonating arms 30; a spindle portion 40 provided at the other end; and two support arms 50 which protrude from the end surface facing a portion of the base portion 20 connected to the resonating arms 30 and which extend in parallel at both sides of the resonating arms 30.

A groove 35 is formed in the resonating arm 30. As shown in FIG. 2A, the groove 35 is formed at the same position on both the top and bottom surfaces of each of the two resonating arms 30 so as to have the same position, the same width, the same length, and the same depth, and has an approximately H sectional shape.

In addition, tapered portions 25 are formed in the resonating arm 30 in the ±X directions of the resonating arm 30. The tapered portions 25 are symmetrical to each other with respect to the vibration center of the resonating arm 30 (axisymmetrical with respect to the centerline which bisects the width of the resonating arm 30). In addition, the tapered portion 25 has a shape whose width increases toward a portion of the tapered portion 25 which is connected to the base portion 20, from a portion of the tapered portion 25 connected to the resonating arm 30. The shape of the tapered portion 25 will be described with reference to FIG. 2B.

Here, the width and length of the tapered portion are expressed as Wt and Lt, and the width and length of the resonating arm 30 are expressed as W and L. In addition, the length L of the resonating arm 30 is a length including the spindle portion 40 and the tapered portion 25. In addition, the ratio of the width Wt of the tapered portion 25 and the width W of the resonating arm 30 is expressed as a taper width occupancy $\xi$, and the ratio of the length Lt of the tapered portion 25 and the length L of the resonating arm 30 is expressed as a taper length occupancy $\eta$. Therefore, the taper width occupancy can be expressed as $\xi=2Wt/W$, and the taper length occupancy can be expressed as $\eta=Lt/L$.

In the present embodiment, it was found out that thermoelastic loss can be suppressed by controlling the shape of the tapered portion 25 with the taper length occupancy $\eta$ and the taper width occupancy $\xi$. This will be described with reference to the accompanying drawings.

Figure 3:
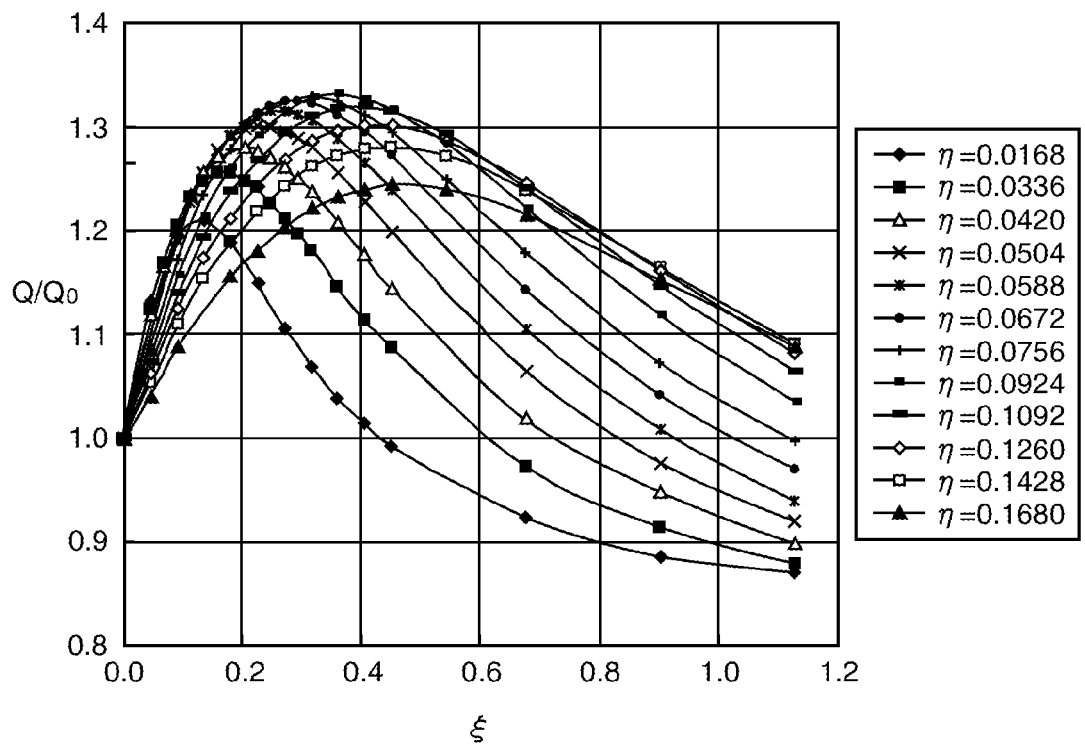
FIG. 3 is a graph showing the relationship among the taper length occupancy η, the taper width occupancy ξ, and a Q factor.

FIG. 3 is a graph showing the relationship among the taper length occupancy $\eta$, the taper width occupancy $\xi$, and a Q factor. FIG. 3 shows a change of $Q/Q_0$ (vertical axis), which is a standardized Q factor, with respect to the taper width occupancy $\xi$ (horizontal axis) when the taper length occupancy $\eta$ is made to change from $\eta=0.0168$ to $\eta=0.1680$ as a parameter. In addition, $Q/Q_0$ is a standardized ratio of $Q_0$, obtained by settling a Q factor when there is no tapered portion, and Q, which is a Q factor when there is a tapered portion.

As shown in FIG. 3, in the taper length occupancy $\eta$ range of 0.0168 to 0.1680, $Q/Q_0$ is equal to or larger than 1 in a certain range of the taper width occupancy $\xi$. That is, there is a combination in which the Q factor is not decreased even if a tapered portion is provided, compared with the case where there is no tapered portion. FIG. 3 shows that combination regions with $Q/Q_0$ equal to or larger than 1.1, 1.2, and 1.3 are present.

In addition, the reason why the Q factor decreases as the taper width occupancy $\xi$ increases is presumably that flexural vibration of the resonating arm 30 moves the entire base portion 20 and causes large distortion (temperature gradient) in a cut portion 55 (refer to FIG. 1).

Accordingly, by controlling the shape of the tapered portion 25 with the taper length occupancy $\eta$ and the taper width occupancy $\xi$, it is possible to find out the shape of the tapered portion 25 capable of suppressing the thermoelastic loss. As a result, it is possible to realize the resonator element 10 with a stable vibration mode by increasing the Q factor compared with the case where the tapered portion 25 is not provided or the case where a tapered portion is simply provided without taking the taper length occupancy $\eta$ and the taper width occupancy $\xi$ into consideration.

Moreover, as it is clear from FIG. 3 that an appropriate combination of the taper length occupancy $\eta$ and the taper width occupancy $\xi$ is necessary in order to obtain more preferable $Q/Q_0$, specific examples will be described hereinafter.

FIRST EXAMPLE

First, a range where $Q/Q_0$ is equal to or larger than 1.1 will be described with reference to FIG. 4.

Figure 4:
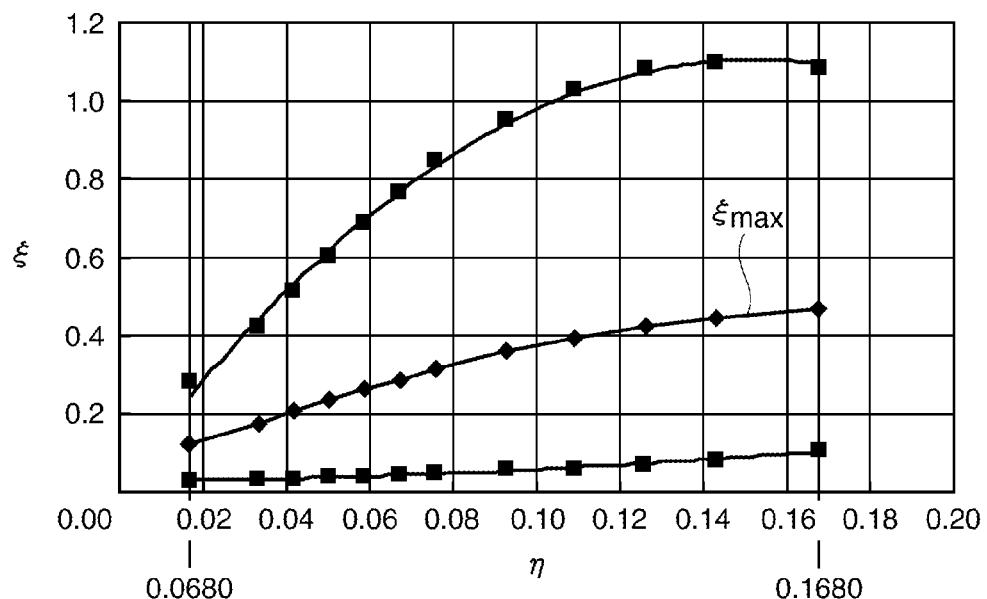
FIG. 4 is a graph showing the relationship between the taper length occupancy η (horizontal axis) at which $Q/Q_0$ is equal to or larger than 1.1 and the taper width occupancy ξ (vertical axis).

FIG. 4 is a graph showing the relationship between the taper length occupancy $\eta$ (horizontal axis) at which $Q/Q_0$ is equal to or larger than 1.1 and the taper width occupancy $\xi$ (vertical axis). As the taper length occupancy $\eta$ and the taper width occupancy $\xi$ used here, the ranges thereof where $Q/Q_0$ is equal to or larger than 1.1 are extracted from FIG. 3 described above.

In FIG. 4, an uppermost curve shows an upper limit range of the taper width occupancy $\xi$ with respect to a change of the taper length occupancy $\eta$ at which $Q/Q_0$ is equal to or larger than 1.1, a lowermost curve shows a lower limit range, and a middle curve shows a graph of the case that only the maximum value ($\xi$max) are plotted. In the uppermost graph, the taper width occupancy $\xi$ is expressed as $\xi=-4.723\times10^1\eta^2+1.434\times10^1\eta+1.711\times10^{-2}$ when the range of the taper length occupancy $\eta$ is $0.0168\leq\eta\leq0.1680$.

Moreover, in the lowermost graph, the taper width occupancy $\xi$ is expressed as $\xi=2.409\eta^2+4.728\times10^{-2}\eta30\ 2.959\times10^{-2}$ when the range of the taper length occupancy $\eta$ is $0.0168\leq\eta\leq0.1680$.

That is, when the range of the taper length occupancy $\eta$ is $0.0168\leq\eta\leq0.1680$, the taper width occupancy at which $Q/Q_0\geq1.1$ is satisfied is expressed by the following expression.

$$2.409\eta^2+4.728\times10^{-2}\eta+2.959\times10^{-2}\leq\xi\leq-4.723\times10^1\eta^2+1.434\times10^1\eta+1.711\times10^{-2} \quad (1)$$

By setting the taper width occupancy $\xi$ within the range of expression (1) with respect to the taper length occupancy $\eta$, it is possible to obtain the Q factor 1.1 times or more the Q factor when a tapered portion is not provided. As a result, the resonator element 10 with a stable vibration mode can be realized.

SECOND EXAMPLE

Next, the range where $Q/Q_0$ is equal to or larger than 1.2 will be described with reference to FIG. 5.

Figure 5:
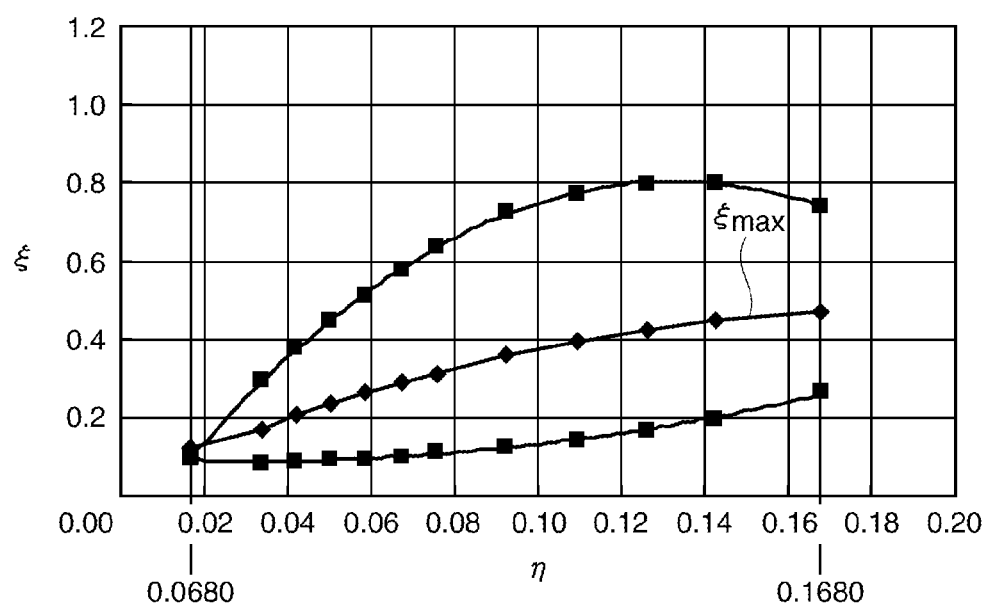
FIG. 5 is a graph showing the relationship between the taper length occupancy η (horizontal axis) at which $Q/Q_0$ is equal to or larger than 1.2 and the taper width occupancy ξ (vertical axis).

FIG. 5 is a graph showing the relationship between the taper length occupancy $\eta$ (horizontal axis) and the taper width occupancy $\xi$ (vertical axis) when $Q/Q_0$ is equal to or larger than 1.2. As the taper length occupancy $\eta$ and the taper width occupancy $\xi$ used here, the ranges thereof where $Q/Q_0$ is equal to or larger than 1.2 are extracted from FIG. 3 described above.

In FIG. 5, an uppermost curve shows an upper limit range of the taper width occupancy $\xi$ with respect to a change of the taper length occupancy $\eta$ at which $Q/Q_0$ is equal to or larger than 1.2, a lowermost curve shows a lower limit range, and a middle curve shows a graph of the case that only the maximum values ($\xi$max) are plotted. In the uppermost graph, the taper width occupancy $\xi$ is expressed as $\xi=-5.255\times10^1\eta^2+1.394\times10^1\eta-1.219\times10^{-1}$ when the range of the taper length occupancy $\eta$ is $0.0168\leq\eta\leq0.1680$.

Moreover, in the lowermost graph, the taper width occupancy $\xi$ is expressed as $\xi=9.417\eta^2-6.358\times10^{-1}\eta+9.984\times10^{-2}$ when the range of the taper length occupancy $\eta$ is $0.0168\leq\eta\leq0.1680$.

That is, when the range of the taper length occupancy $\eta$ is $0.0168\leq\eta\leq0.1680$, the taper width occupancy $\xi$ at which $Q/Q_0\leq1.2$ is satisfied is expressed by the following expression.

$$9.417\eta^2-6.358\times10^{-1}\eta+9.984\times10^{-2}\leq\xi\leq-5.255\times10^1\eta^2+1.394\times10^1\eta-1.219\times10^{-1} \quad (2)$$

By setting the taper width occupancy $\xi$ within the range of expression (2) with respect to the taper length occupancy $\eta$, it is possible to obtain the Q factor 1.2 times or more compared to the Q factor when a tapered portion is not provided. As a result, the resonator element 10 with a more stable vibration mode can be realized.

THIRD EXAMPLE

Next, the range where $Q/Q_0$ is equal to or larger than 1.3 will be described with reference to FIG. 6.

Figure 6:
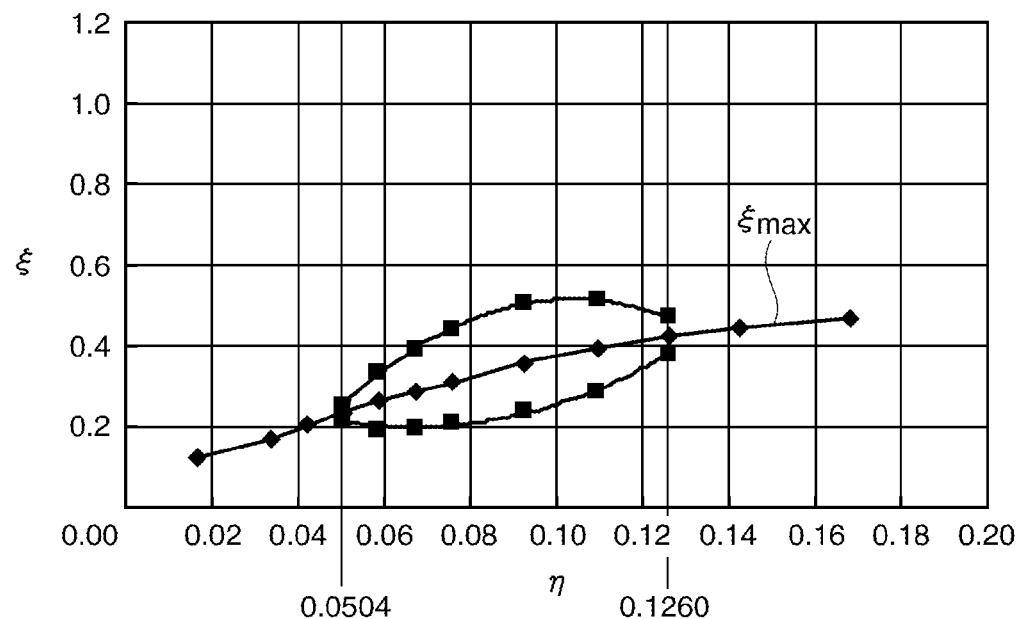
FIG. 6 is a graph showing the relationship between the taper length occupancy η (horizontal axis) at which $Q/Q_0$ is equal to or larger than 1.3 and the taper width occupancy ξ (vertical axis).

FIG. 6 is a graph showing the relationship between the taper length occupancy $\eta$ (horizontal axis) and the taper width occupancy $\xi$ (vertical axis) when $Q/Q_0$ is equal to or larger than 1.3. As the taper length occupancy $\eta$ and the taper width occupancy $\xi$ used here, the ranges thereof where $Q/Q_0$ is equal to or larger than 1.3 are extracted from FIG. 3 described above.

In FIG. 6, an uppermost curve shows an upper limit range of the taper width occupancy $\xi$ with respect to a change of the taper length occupancy $\eta$, a lowermost curve shows a lower limit range, and a middle curve shows a graph of the case that only the maximum values ($\xi$max) are plotted. In the uppermost graph, the taper width occupancy $\xi$ is expressed as $\xi = -9.160 \times 10^1 \eta^2 + 1.899 \times 10^1 \eta - 4.679 \times 10^{-1}$ when the range of the taper length occupancy $\eta$ is $0.0504 \leq \eta \leq 0.1260$.

Moreover, in the lowermost graph, the taper width occupancy $\xi$ is expressed as $\xi = 5.191 \times 10^1 \eta^2 - 6.959 \eta + 4.339 \times 10^{-1}$ when the range of the taper length occupancy $\eta$ is $0.0504 \leq \eta \leq 0.1260$.

That is, when the range of the taper length occupancy $\eta$ is $0.0504 \leq \eta \leq 0.1260$, the taper width occupancy $\xi$ at which $Q/Q_0 \geq 1.3$ is satisfied is expressed by the following expression.

$$5.191 \times 10^1 \eta^2 - 6.959 \eta + 4.339 \times 10^{-1} \leq \xi \leq -9.160 \times 10^1 \eta^2 + 1.899 \times 10^1 \eta - 4.679 \times 10^{-1} \quad (3)$$

By setting the taper width occupancy $\xi$ within the range of expression (3) with respect to the taper length occupancy $\eta$, it is possible to obtain the Q factor of 1.3 times or more compared to the Q factor when a tapered portion is not provided. As a result, the resonator element 10 with a more stable vibration mode can be realized.

Note that, in the first to third examples described above, the tapered portion 25 is of a shape formed by one straight line connecting the position of the tapered portion connected to the resonating arm 30 and the position thereof connected to the base portion 20. However, if the tapered portion is of a shape formed by connecting a plurality of straight lines or a curved line, it is possible to further reduce the thermoelastic loss and to increase the Q factor. Specific examples thereof will be described with reference to the accompanying drawings.

FOURTH EXAMPLE

Next, a fourth example will be described with reference to the accompanying drawings. The fourth example is characterized in that the tapered portion 25 is formed by connection of a plurality of straight lines, while the tapered portion 25 is formed by one straight line in the first to third examples. Now, the tapered portion 25 will be described using an enlarged view thereof.

Figure 7:
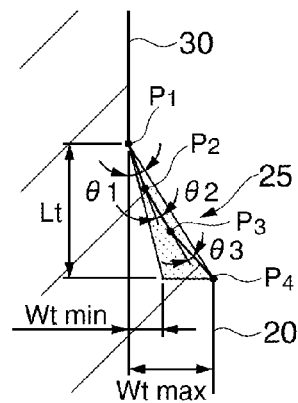
FIG. 7 is a partial plan view showing a tapered portion related to a fourth example.

FIG. 7 is a partial plan view showing a tapered portion related to the fourth example. Note that, although the tapered portion 25 is formed in two places for each of the two resonating arms 30, that is, in a total of four places, only one of these places is shown in FIG. 7. As shown in FIG. 7, the tapered portion 25 is formed by connecting three straight lines. Here, it is assumed that the position of the tapered portion connected to the resonating arm 30 is a P1 position, the position thereof connected to the base portion 20 is a P4 position, and the positions thereof at which the straight line is discontinuous between the P1 and P4 positions are P2 and P3 positions.

In addition, a crossing angle formed by one straight line, which connects the position (P1 position) connected to the resonating arm 30 and the position (P4 position) connected to the base portion 20, and the extended line of the resonating arm 30 is expressed as $\theta 1$, a crossing angle formed by the extended line of the straight line which connects the P1 and P2 positions to each other, and the straight line which connects the P2 and P3 positions to each other is expressed as $\theta 2$, and a crossing angle formed by the extended line of the straight line which connects the P2 and P3 positions to each other, and the straight line which connects the P3 and P4 positions to each other is expressed as $\theta 3$. The shape of the one straight line which connects the P1 and P4 positions to each other is equivalent to the shape of the tapered portion 25 described in the first to third examples.

In the tapered portion 25 of the present example, the crossing angles $\theta 2$ and $\theta 3$ in discontinuous portions (P2 and P3 positions) are smaller than the crossing angle $\theta 1$ between the extended line of the resonating arm 30 and the straight line connecting the P1 and P4 positions to each other. In addition, the tapered portion 25 is located in a triangle formed by straight lines connecting Lt in a range which satisfies the conditions of the taper length occupancy $\eta$ and the taper width occupancy $\xi$ in the first to third examples described above, to Wtmax and Wtmin when the Lt is fixed.

Thus, if the tapered portion 25 is made to have a shape formed by connecting a plurality of straight lines, stress generated in the tapered portion is dispersed compared with the case where the tapered portion 25 is formed by one straight line. Accordingly, distortion is also dispersed, temperature gradient is decreased and thus the heat flow is suppressed. As a result, a thermoelastic loss is reduced, and the Q factor can be increased.

Therefore, as the number of straight lines discontinuously connected to each other increases (that is, as the number of discontinuous portions increases) in the tapered portion 25, stress generated in the tapered portion is dispersed, so that a thermoelastic loss can be reduced.

FIFTH EXAMPLE

Next, a fifth example will be described with reference to the accompanying drawings. The fifth example is characterized in that the tapered portion 25 is formed by a curved line, while the tapered portion 25 is formed by connecting a plurality of straight lines to each other in the fourth example described above. Now, the tapered portion 25 will be described using an enlarged view thereof.

Figure 8:
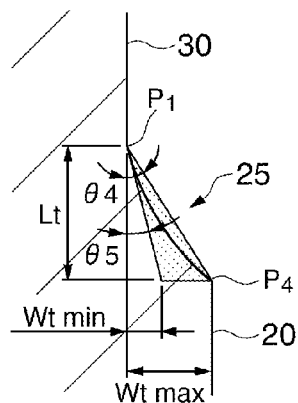
FIG. 8 is a partial plan view showing a tapered portion related to a fifth example.

FIG. 8 is a partial plan view showing a tapered portion related to the fifth example. Note that, although the tapered portion 25 is formed in two places for each of the two resonating arms 30, that is, in a total of four places, only one of these places is shown in FIG. 8. As shown in FIG. 8, the tapered portion 25 is formed by one curve connecting the position (P1 position) which is connected to the resonating arm 30, and the position (P4 position) which is connected to the base portion 20.

Here, the crossing angle between the curve and the extended line of the resonating arm 30 is set to $\theta 4$. That is, the crossing angle $\theta 4$ is an angle formed by the tangential line of the curve of the tapered portion 25 at the P1 position and the extended line of the resonating arm 30. In addition, the crossing angle formed by the extended line of the resonating arm and the straight line which connects the position (P1 position)

connected to the resonating arm 30 and the position (P4 position) connected to the base portion 20, is set to θ5. In addition, the crossing angle θ4 is set to be smaller than the crossing angle θ5.

In addition, the tapered portion 25 is located in a triangle formed by straight lines connecting Lt in a range which satisfies the conditions of the taper length occupancy η and the taper width occupancy ξ in the first to third examples described above, to Wtmax and Wtmin when the Lt is fixed.

As previously described in the fourth example, the stress generated in the tapered portion is dispersed and the thermoelastic loss can be reduced as the number of straight lines discontinuously connected to each other increases in the tapered portion 25. Accordingly, if the number of straight lines discontinuously connected to each other is made infinite, the tapered portion 25 becomes a curve. Thus, by forming the tapered portion 25 as a curved line, the stress generated in the tapered portion is dispersed compared with the case where the tapered portion 25 is formed by using a straight line. Accordingly, distortion is also dispersed, temperature gradient is decreased and the heat flow is suppressed. As a result, a thermoelastic loss is further reduced, and the Q factor can be increased.

Note that, if the conditions of each of the first to fourth examples described above are satisfied, the same effects can be acquired even if the position of the tapered portion 25 is changed. This will be described in a sixth example.

SIXTH EXAMPLE

The sixth example is characterized in that the position of the tapered portion 25 connected to the base portion 20 is located in an inner position from the +X-direction end of the base portion 20, while the connection position of the tapered portion 25 is at the +X-direction end of the base portion 20 in the first to fifth examples described above. Now, the tapered portion 25 will be described using an enlarged view thereof.

Figure 9:
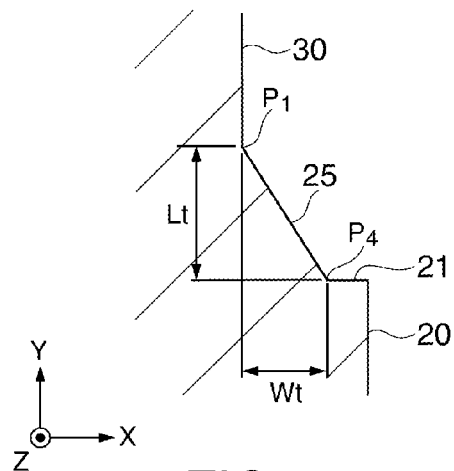
FIG. 9 is a partial plan view showing a tapered portion related to a sixth example.

FIG. 9 is a partial plan view showing a tapered portion related to the sixth example. Note that, although the tapered portion 25 is formed in two places for each of the two resonating arms 30, that is, in a total of four places, only one of these places is shown in FIG. 9. As shown in FIG. 9, the tapered portion 25 is formed by one straight line connecting the position (P1 position) which is connected to the resonating arm 30, and the position (P4 position) which is connected to the base portion 20.

Here, the P4 position is located in an inner position from the +X-direction end of the base portion 20, and a straight portion 21 is formed between the P4 position and the +X-direction end.

Note that, the tapered portion 25 may have a shape obtained by connecting a plurality of straight lines as in the fourth example or may be of a shape formed by one continuous curved line as in the fifth example. Even if the tapered portion 25 has such shapes, the same effects as in the examples described above can be acquired.

In addition, although the tuning fork type resonator element has been described as an example of the resonator element 10, it may also be applied to an acceleration sensor or a gyro sensor.

Although the spindle portion 40 is provided at the distal end of the resonating arm 30, the spindle portion 40 may not be provided. When the spindle portion is provided, it is more preferable that a tapered portion based on the technical idea of each example described above is provided in the connection portion between the spindle portion and the resonating arm.

In addition, the support arm 50 may be removed, and a fixed portion of the resonator element 10 may be made to serve as the base portion 20.

Resonator

Next, an example of a resonator using the resonator element 10 will be described with reference to the accompanying drawings.

Figure 10A:
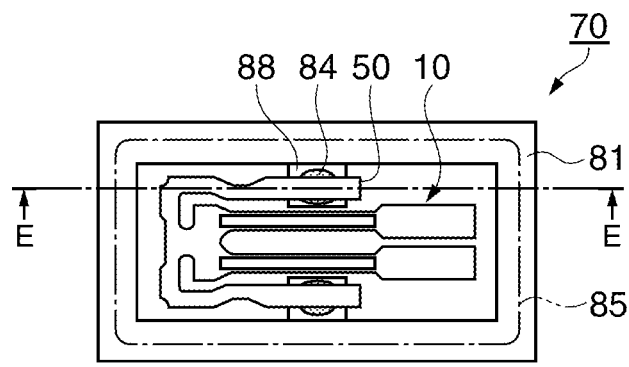
FIGS. 10A and 10B are views showing the schematic configuration of a resonator, where
Figure 10B:
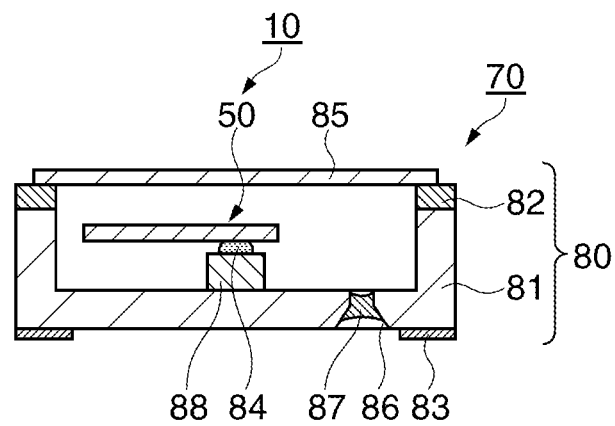

FIGS. 10A and 10B are views showing the schematic configuration of a resonator. FIG. 10A is a plan view, and FIG. 10B is a cross-sectional view taken along the line E-E of FIG. 10A. In FIGS. 10A and 10B, a resonator 70 is configured to include the resonator element 10 and a package 80 in which the resonator element 10 is housed.

The package 80 includes a package base 81, a seam ring 82, a lid 85, and the like. In the package base 81, a recess is formed so that the resonator element 10 can be accommodated. In the recess, a connection pad 88 connected to amount electrode (not shown) of the resonator element 10 is provided. The connection pad 88 is connected to a wiring line in the package base 81 and is formed so as to be electrically connective to an external connection terminal 83 provided in the outer periphery of the package base 81.

The seam ring 82 is provided around the recess of the package base 81. In addition, a through hole 86 is provided in a bottom portion of the package base 81.

The resonator element 10 is bonded and fixed to the connection pad 88 of the package base 81 with a conductive adhesive 84 by the support arm 50. Moreover, in the package 80, the lid 85 which covers the recess of the package base 81 and the seam ring 82 are seam-welded.

A sealant 87 formed of a metallic material or the like is filled in the through hole 86 of the package base 81. The sealant 87 is solidified after being melted in a decompressed atmosphere to airtightly seal the through hole 86, so that the inside of the package base 81 can maintain a decompressed state or a vacuum state.

The resonator element 10 is excited by a driving signal supplied from the outside through an external connection terminal 83 and as a result, the resonator 70 oscillates (resonates) at a predetermined frequency (for example, 32 kHz).

As described above, since the resonator 70 has the resonator element 10 in which the tapered portion described in the first to sixth examples is formed, the Q factor can be increased by suppressing vibration leakage. As a result, stable vibration characteristics can be obtained. In addition, it is possible to prevent the resonator element 10 from being broken by an impact or prevent deterioration of a vibration mode.

In addition, since the resonator element 10 is housed in the package 80 and the resonator element 10 is vibrated in a vacuum environment within the package 80, it is possible to maintain more stable vibration over a long period of time. In addition, since the resonator element 10 is housed in the package, it is easy in handling and it can be protected against external environments, such as humidity.

What is claimed is:
1. A vibrating piece comprising:
a base; and
a vibrating arm that has a tapered portion extending from the base and that has an arm portion extending from the tapered portion, the vibrating arm performing flexural vibration, wherein
a width of the tapered portion increases toward the base, and
when a length of the vibrating arm is L, a width of the arm portion is W, a length of the tapered portion along with the arm portion is Lt, a width of the tapered portion along with the base is Wt, a taper length occupancy is $\eta=Lt/L$, and a taper width occupancy is $\xi=2Wt/W$, the following formulas are satisfied:

$$0.0168 \leq \eta \leq 0.1680;$$

$$2.409\eta^2+4.728\times10^{-2}\eta+2.959\times10^{-2} \leq \xi \leq -4.723\times 10^1\eta^2+1.434\times10^1\eta+1.711\times10^{-2};\text{ and}$$

wherein $L \neq 1.65$ mm, $W \neq 0.11$ mm, $Lt \neq 0.2$ mm, and $Wt \neq 0.01$ mm.

2. The vibrating piece according to claim 1, wherein an outer circumference of the tapered portion is one of a straight line or a curved line.

3. The vibrating piece according to claim 2, wherein the outer circumference of the tapered portion is formed between a first position that connects between the arm portion and a first end of the outer circumference and a second position that connects between the base and a second end of the outer circumference, the outer circumference is formed by connection of a plurality of straight lines, and crossing angles between the plurality of straight lines are smaller than a crossing angle between an extended line of the vibrating arm and a straight line connecting the first and second positions.

4. The vibrating piece according to claim 2, wherein the outer circumference of the tapered portion is formed between a first position that connects between the arm portion and a first end of the outer circumference and a second position that connects between the base and a second end of the outer circumference, the outer circumference is formed by one continuous curved line connecting the first and second positions, and a crossing angle between the curved line and an extended line of the vibrating arm is smaller than a crossing angle between the extended line of the vibrating arm and a straight line connecting the first and second positions.

5. The resonator element according to claim 1, wherein the vibrating arm has a weight provided at a tip of the arm portion.

6. The resonator element according to claim 5, wherein a width of the weight is larger than the width of the arm portion.

7. A vibrator comprising:
a vibrating piece according to claim 1; and
a package that houses the vibrating piece.

8. A vibrating piece comprising:
a base; and
a vibrating arm that has a tapered portion extending from the base and that has an arm portion extending from the tapered portion, the vibrating arm performing flexural vibration, wherein a width of the tapered portion increases toward the base, and when a length of the vibrating arm is L, a width of the arm portion is W, a length of the tapered portion along with the arm portion is Lt, a width of the tapered portion along with the base is Wt, a taper length occupancy is $\eta=Lt/L$, and a taper width occupancy is $\xi=2Wt/W$, the following formulas are satisfied:

$$0.0168 \leq \eta \leq 0.1680;$$

$$9.417\eta^2-6.358\times10^{-1}\eta+9.984\times10^{-2} \leq \xi \leq -5.255\times 10^1\eta^2+1.394\times10^1\eta-1.219\times10^{-1};\text{ and}$$

wherein $L \neq 1.65$ mm, $W \neq 0.11$ mm, $Lt \neq 0.2$ mm, and $Wt \neq 0.01$ mm.

9. The vibrating piece according to claim 8, wherein an outer circumference of the tapered portion is one of a straight line or a curved line.

10. The vibrating piece according to claim 9, wherein the outer circumference of the tapered portion is formed between a first position that connects between the arm portion and a first end of the outer circumference and a second position that connects between the base and a second end of the outer circumference, the outer circumference is formed by connection of a plurality of straight lines, and crossing angles between the plurality of straight lines are smaller than a crossing angle between an extended line of the vibrating arm and a straight line connecting the first and second positions.

11. The vibrating piece according to claim 9, wherein the outer circumference of the tapered portion is formed between a first position that connects between the arm portion and a first end of the outer circumference and a second position that connects between the base and a second end of the outer circumference, the outer circumference is formed by one continuous curved line connecting the first and second positions, and a crossing angle between the curved line and an extended line of the vibrating arm is smaller than a crossing angle between the extended line of the vibrating arm and a straight line connecting the first and second positions.

12. The resonator element according to claim 8, wherein the vibrating arm has a weight provided at a tip of the arm portion.

13. The resonator element according to claim 12, wherein a width of the weight is larger than the width of the arm portion.

14. A vibrator comprising:
a vibrating piece according to claim 8; and
a package that houses the vibrating piece.

* * * * *